US008735925B2

(12) United States Patent
Zaima et al.

(10) Patent No.: US 8,735,925 B2
(45) Date of Patent: *May 27, 2014

(54) SEMICONDUCTOR LIGHT EMITTING DEVICE AND METHOD FOR MANUFACTURING THE SAME

(75) Inventors: Kotaro Zaima, Tokyo (JP); Toru Gotoda, Yokohama (JP); Toshiyuki Oka, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/450,063

(22) Filed: Apr. 18, 2012

(65) Prior Publication Data

US 2012/0199811 A1 Aug. 9, 2012

Related U.S. Application Data

(63) Continuation of application No. 12/874,475, filed on Sep. 2, 2010, now Pat. No. 8,178,891.

(30) Foreign Application Priority Data

Mar. 3, 2010 (JP) .................................. 2010-046905

(51) Int. Cl.
*H01L 33/00* (2010.01)
(52) U.S. Cl.
USPC .................. 257/98; 257/13; 257/14; 257/95; 257/99; 257/100; 257/E33.008

(58) Field of Classification Search
USPC ............. 257/13, 14, 95, 98, 99, 100, E33.008
See application file for complete search history.

(56) References Cited

U.S. PATENT DOCUMENTS

| 8,178,891 B2 * | 5/2012 | Zaima et al. ..................... 257/95 |
| 2010/0025717 A1* | 2/2010 | Fujii et al. ........................ 257/98 |
| 2011/0018024 A1* | 1/2011 | Fukshima et al. ............... 257/98 |
| 2012/0032218 A1* | 2/2012 | Choi et al. ....................... 257/98 |

FOREIGN PATENT DOCUMENTS

| JP | 2008-235362 | 10/2008 |
| JP | 2009-231560 | 10/2009 |

* cited by examiner

*Primary Examiner* — Tan N Tran
(74) *Attorney, Agent, or Firm* — Oblon, Spivak, McClelland, Maier & Neustadt, L.L.P.

(57) ABSTRACT

Certain embodiments provide a semiconductor light emitting device including: a first metal layer; a stack film including a p-type nitride semiconductor layer, an active layer, and an n-type nitride semiconductor layer; an n-electrode; a second metal layer; and a protection film protecting an outer circumferential region of the upper face of the n-type nitride semiconductor layer, side faces of the stack film, a region of an upper face of the second metal layer other than a region in contact with the p-type nitride semiconductor layer, and a region of an upper face of the first metal layer other than a region in contact with the second metal layer. Concavities and convexities are formed in a region of the upper face of the n-type nitride semiconductor layer, the region being outside the region in which the n-electrode is provided and being outside the regions covered with the protection film.

7 Claims, 6 Drawing Sheets

(a)

(b)

(c)

(a)

(b)

SEMICONDUCTOR LIGHT EMITTING DEVICE AND METHOD FOR MANUFACTURING THE SAME

CROSS-REFERENCE TO RELATED APPLICATION

This application is a continuation of and claims the benefit of priority under 35 U.S.C. §120 from U.S. Ser. No. 12/874,475, filed Sep. 2, 2010 now U.S. Pat. No. 8,178,891, and claims the benefit of priority from prior Japanese Patent Application No. 2010-46905 filed on Mar. 3, 2010 in Japan, the entire contents of which are incorporated herein by reference.

FIELD

Embodiments described herein relate to a semiconductor light emitting device and a method for manufacturing the semiconductor light emitting device.

BACKGROUND

To achieve high efficiencies and high outputs, nitride semiconductor light emitting devices (hereinafter also referred to as LEDs (Light Emitting Diodes)) designed for white lighting devices are being improved in crystalline structures and device structures, and higher internal quantum efficiencies and higher light extraction efficiencies are being realized. Where a nitride semiconductor is crystal-grown, a sapphire substrate is often used, because it is inexpensive, and stable in high temperature. A crystal growth with high crystallinity can be performed on a sapphire substrate with a low-temperature buffer. However, being an insulator, a sapphire substrate does not have conductive properties and is low in thermal conductivity. Therefore, electrodes cannot be formed on the back face side of a sapphire substrate, and p- and n-electrodes need to be formed on the nitride semiconductor side. Therefore, the tendency to cause higher series resistance and the low heat release properties during a high-power operation become problems in achieving even higher efficiencies and outputs.

A thin-film nitride semiconductor LED is known as one of the LED structures that eliminate the above problems and improve luminous efficiencies and outputs. Such a thin-film nitride semiconductor LED transfers LED structural crystals grown on a sapphire substrate onto another supporting substrate such as a Si substrate, a copper substrate, or a gold substrate. As devices are formed after the transfer onto a supporting substrate having conductive properties and high thermal conductivity, the current spread becomes larger by vertical energization, and the electric conductive properties are improved. Further, the heat release properties are also improved. Also, by forming a structure that has an n-layer as an upper face through a transfer and extracts light from the n-layer side, a transparent electrode for diffusing current becomes unnecessary for the n-layer having lower resistance than a p-layer. Since light is not absorbed by a transparent electrode, the light extraction efficiency becomes higher.

This process of transfer used here includes a process to bond crystals (epitaxial crystals) formed through an epitaxial growth to the supporting substrate, and a lift-off process to detach the epitaxial crystals from the sapphire substrate. The bonding process may involve a plating technique or a joining technique utilizing weight and heat, and the lift-off process may involve a laser lift-off technique utilizing thermolysis of an interface caused by a laser or a chemical lift-off technique.

In such a thin-film LED structure, the difference in refractive index between the surface of a GaN substrate and the external air is as large as 2.5 times where only a laser lift-off process has been carried out, and the light reflection from the boundary face lowers the light extraction efficiency.

To counter this problem, a technique of producing concavities and convexities on the surface of each chip has been suggested. The concavities and convexities are formed by regrowing, polishing, and etching an n-type nitride semiconductor layer. According to a method for simple formation, concavities and convexities are formed by roughening the surface through alkaline etching performed on the n-layer on the upper face of a GaN substrate on a supporting substrate. In this manner, the light extraction efficiency is made higher. To sufficiently increase the light extraction efficiency, it is necessary to subject each device containing epitaxial crystals to processing in an alkaline solution for a sufficiently long period of time. Therefore, formation of a protection film that protects the epitaxial crystals and prevents short-circuiting and leakage is critical.

However, if a conventional protection film is subjected to long-time processing with a high-density alkaline solution, not only the surface of the subject n-layer but also the side faces of the epitaxial crystals and the active layer are etched, resulting in luminous efficiency degradation, leakage, and short-circuiting. Also, cracks might be formed in the protection film and the epitaxial crystals due to the load and the variation in temperature during the joining process and the large impact of the gas pressure or the like caused by the laser lift-off process performed when thin-film LEDs are formed. Therefore, the challenge is to obtain a highly-reliable semiconductor light emitting device that has such a rough surface as to achieve higher light extraction efficiency in the surface of a nitride semiconductor, and has fewer defects.

DETAILED DESCRIPTION

Figure 1:
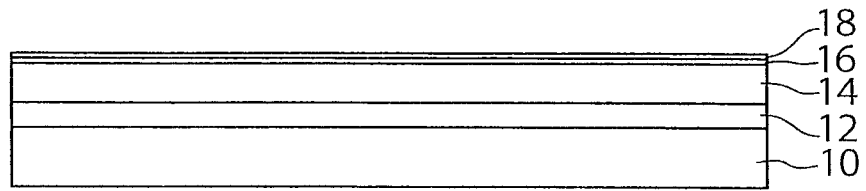
FIGS. 1(a) through 1(c) are cross-sectional views showing procedures for manufacturing semiconductor light emitting devices according to an embodiment.
Figure 1:
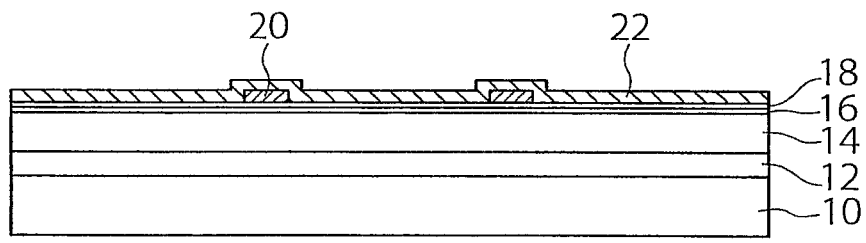
Figure 1:
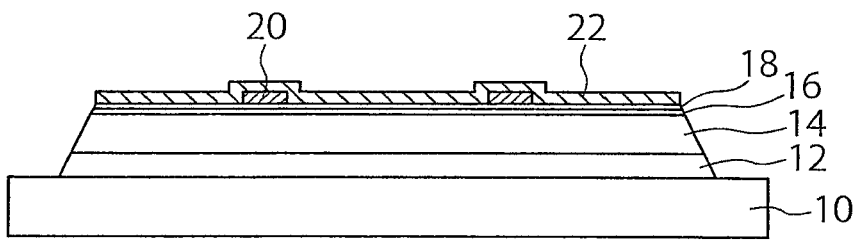
Figure 2:
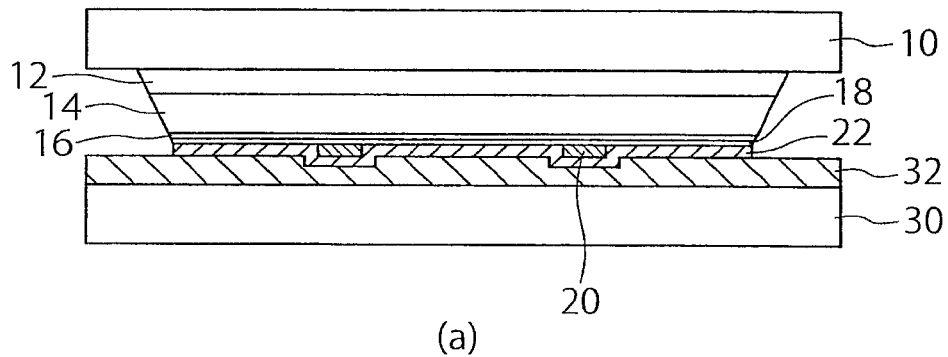
FIGS. 2(a) and 2(b) are cross-sectional views showing procedures for manufacturing semiconductor light emitting devices according to the embodiment.
Figure 2:
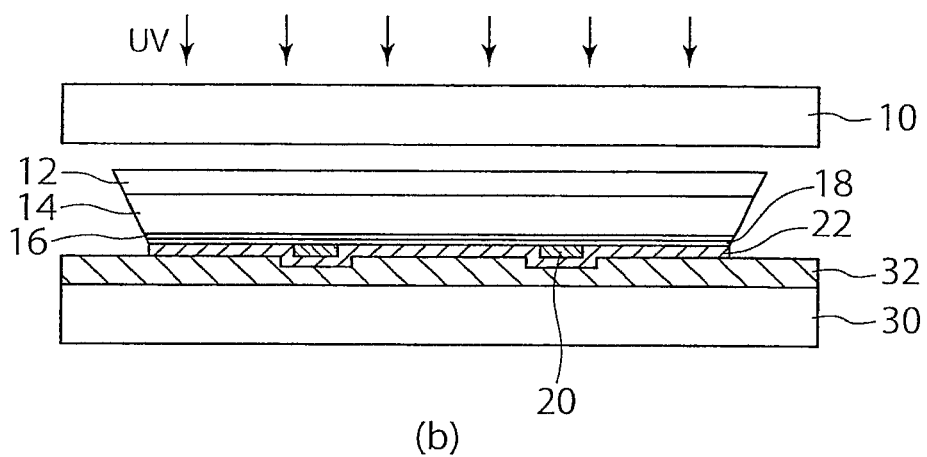
Figure 3:
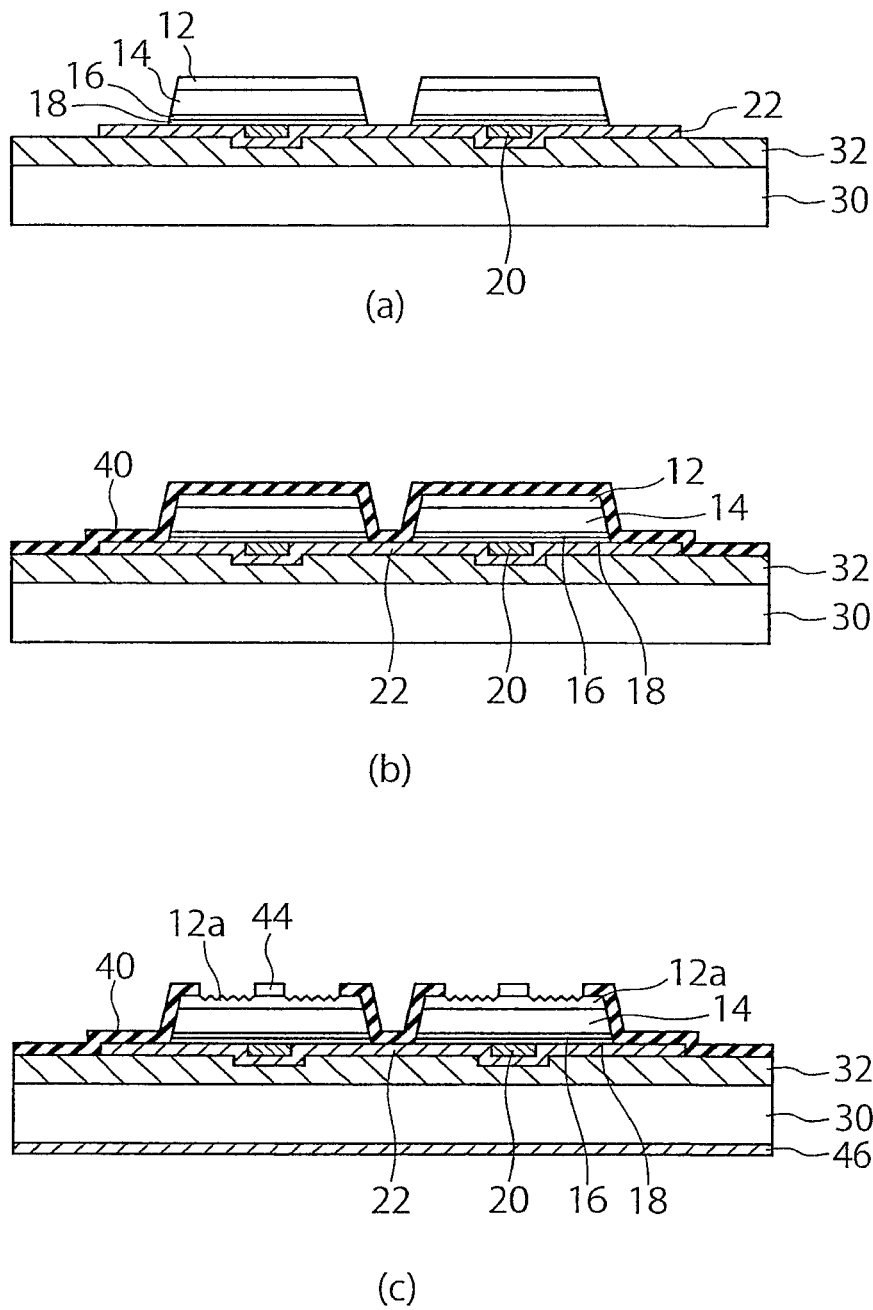
FIGS. 3(a) through 3(c) are cross-sectional views showing procedures for manufacturing semiconductor light emitting devices according to the embodiment.

Certain embodiments provide a semiconductor light emitting device including: a substrate having a first face and a second face opposed to the first face; a first metal layer having a lower face facing to the first face of the substrate and an upper face; a stack film including a p-type nitride semiconductor layer having a lower face facing to the upper face of the first metal layer and an upper face, an active layer provided on the upper face of the p-type nitride semiconductor layer and including a multiquantum well structure of a nitride semiconductor, and an n-type nitride semiconductor layer having a lower face facing to the active layer and an upper face, the stack film having a tapered shape in cross-section, with an area of a film plane gradually increasing from the n-type nitride semiconductor layer toward the p-type nitride semiconductor layer; an n-electrode provided in a partial region of the upper face of the n-type nitride semiconductor layer; a p-electrode provided on the second face of the substrate; a contact electrode provided in a partial region of the lower face of the p-type nitride semiconductor layer; a second metal layer having a lower face facing to the upper face of the first metal layer and an upper face facing to the lower face of the p-type nitride semiconductor layer, the second metal layer covering the contact electrode and being in contact with the contact electrode and the first metal layer, and the second metal layer having a minimum diameter that is smaller than a minimum diameter of the upper face of the first metal layer but is larger than a minimum diameter of the lower face of the p-type nitride semiconductor layer; and a protection film protecting an outer circumferential region of the upper face of the n-type nitride semiconductor layer, side faces of the stack film, a region of the upper face of the second metal layer other than a region in contact with the p-type nitride semiconductor layer, and a region of the upper face of the first metal layer other than a region in contact with the second metal layer, wherein concavities and convexities are formed in a region of the upper face of the n-type nitride semiconductor layer, the region being outside the region in which the n-electrode is provided and being outside the regions covered with the protection film.

The following is a detailed description of an embodiment, with reference to the accompanying drawings.

Referring to FIGS. 1(a) through 4, semiconductor light emitting devices according to the embodiment are described. FIGS. 1(a) through 3(c) show the procedures for manufacturing semiconductor light emitting devices according to the first embodiment.

First, nitride semiconductor layers are sequentially grown on a substrate (a wafer) for growing nitride semiconductor crystals or a sapphire substrate 10 by metal organic chemical vapor deposition (MOCVD), for example. More specifically, a GaN layer 12 to be a buffer layer, an n-type GaN layer 14, an active layer 16 of a multiquantum well structure made of InGaN, and a p-type GaN layer 18 are sequentially grown in this order on the sapphire substrate 10 (FIGS. 1(a)).

P-electrodes (reflecting contact electrodes) 20 are then formed with stack films of Ni and Ag on the p-type GaN layer 18 (FIG. 1(b)). The p-electrodes 20 are formed for respective semiconductor light emitting devices. An adhesive metal film 22 having Ti, Pt, and Au films that are to serve as adhesive metals and are stacked in this order is formed over the nitride semiconductor crystal films 12, 14, 16, and 18, to cover the p-electrodes 20 (FIG. 1(b)). With this arrangement, the portions of the adhesive metal film 22 in the regions where the p-electrodes 20 are formed are turned into convex portions, and the portions of the adhesive metal film 22 in the regions where the p-electrodes 20 are not formed are turned into concave portions (FIG. 1(b)). Patterning is then performed on the adhesive metal film 22 by a known lithography technique. After that, patterning is further performed on the stack film (the nitride semiconductor crystal films) including the p-type GaN layer 18, the active layer 16, the n-type GaN layer 14, and the GaN layer 12 (FIG. 1(c)).

Through the patterning, the nitride semiconductor crystal films on the wafer are turned into a mesa having a tapered shape in cross-section, with the area of the film plane gradually increasing from the area of the film plane of the p-type GaN layer 18 to that of the GaN layer 12. Here, the "film plane" means the upper plane of each of the layers. When patterning is performed on the stack film, a patterned adhesive metal film may be used as a mask. Alternatively, patterning may be performed on the stack film before the adhesive metal film 22 is formed, and after the patterning, the adhesive metal film 22 may be formed.

Meanwhile, an Au—Sn layer 32 to be an adhesive metal film is formed on a Si substrate 30 to be a supporting substrate (FIG. 2(a)). The adhesive metal film 22 on the sapphire substrate 10 and the adhesive metal film 32 on the Si substrate 30 are placed to face each other, and pressure is applied to them at a high temperature of 250° C. or higher over a certain period of time, so that the adhesive metal film 22 on the sapphire substrate 10 and the adhesive metal film 32 on the Si substrate 30 are bonded to each other. In this bonding, the contact electrodes 20 are buried into the adhesive metal film 32, since the melting-point temperature of the contact electrodes 20 is much higher than the melting-point temperature of the adhesive metal film 32 (FIG. 2(a)).

As shown in FIG. 2(b), pulse irradiation is then performed with a UV (Ultra-Violet) laser or a KrF laser of 248 nm in wavelength from the side of the sapphire substrate 10, for example, so as to detach the sapphire substrate 10 from the nitride semiconductor crystal films 12, 14, 16, and 18. The surface of the GaN layer 12 exposed at this point is the surface to be subjected to wet etching.

Patterning is then performed on the nitride semiconductor crystal films 12, 14, 16, and 18 by a known lithography technique, to divide the nitride semiconductor crystal films 12, 14, 16, and 18 into semiconductor light emitting devices. At this point, patterning is not performed on the adhesive metal film 22, and the adhesive metal film 22 is left exposed among the nitride semiconductor crystal films divided into the semiconductor light emitting devices. The patterned nitride semiconductor crystal films are turned into mesas each having a tapered shape in cross-section, with the area of the film plane gradually increasing from the area of the film plane of each GaN layer 12 to that of each p-type GaN layer 18 (FIG. 3(a)).

A $SiO_2$ film 40 as a protection film is then formed to cover the surfaces of the nitride semiconductor crystal films of tapered shapes and the exposed adhesive metal films 22 and 32, for example (FIG. 3(b)). The nitride semiconductor crystal films form mesa structures, the minimum diameter of each lower face of the nitride semiconductor crystal films in contact with the adhesive metal film 22 is smaller than the minimum diameter of the upper face of the adhesive metal film 22, and the minimum diameter of the lower face of the adhesive metal film 22 in contact with the adhesive metal film 32 is smaller than the minimum diameter of the upper face of the adhesive metal film 32. In other words, the structure has a folding-fan shape. Accordingly, the adhesive metal film 22 is in tight contact with the peripheral end region of each lower portion of the nitride semiconductor crystal films each having a mesa shape, and the protection layer 40 without a step separation can be formed, without a void formed between the protection layer 40 and the adhesion metal films 22 and 32.

The protection layer 40 covering the upper face of each semiconductor light emitting device is then removed. However, the protection layer 40 remains on the outer circumferential region of the upper face of each semiconductor light emitting device (the upper face of each GaN layer 12). With this arrangement, the upper face of each semiconductor light emitting device is exposed, except for the outer circumferential region of each upper face (FIG. 3(c)). N-electrodes 44 are then formed at the center portions of the exposed upper faces of the GaN layers 12 (FIG. 3(c)). As the material of the n-electrodes 44, it is preferable to use an alkali-resistant electrode material. It is particularly preferable to use a material containing one of the following metals: Pt, Au, Ni, and Ti. By using such a material, the sizes (height differences) of the concavities and convexities formed in the upper faces of the GaN layers 12 by the later described alkaline etching can be made larger.

After that, etching is performed on the exposed upper faces of the GaN layers 12 with the use of an alkali solution, to roughen the exposed upper faces of the GaN layers 12. In this manner, the GaN layers 12 are turned into GaN layers 12a each having concavities and convexities formed in its exposed upper face (FIG. 3(c)). This is supposedly because electrons or holes travel between the surfaces of the GaN layers 12 and the n-electrodes 44 at the time of etching, and an electrochemical reaction is caused in each surface, accelerating the etching. In this embodiment, a potassium hydroxide solution of 1 mol/l in density and 70° C. in temperature is used as the alkaline solution, and etching is performed for 15 minutes. As the etching smoothly progresses, the surface becomes clouded. While being immersed in the potassium hydroxide solution, the concavities and convexities are exposed to UV rays, and can be made even larger as a result. The concavities and convexities can also be made larger by performing etching while a voltage of is intermittently applied between the n-electrodes 44 and the GaN layers 12. The sizes of the concavities and convexities are several hundreds of nanometers to several micron meters.

Figure 4:
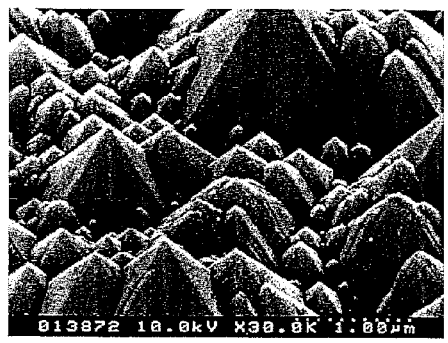
FIG. 4 is an electron micrograph of the surface having concavities and convexities formed thereon in a semiconductor light emitting device according to the embodiment.

FIG. 4 shows an electron micrograph of the upper face of a GaN layer 12 having concavities and convexities formed in the above described manner. As can be seen from FIG. 4, the concavities and convexities vary in size. Accordingly, the reflection from the boundary surface between each GaN layer 12 and the air becomes smaller, and the light extraction efficiency can be made higher.

In this embodiment, the minimum diameter of the lower face in contact with the adhesive metal film 22 is smaller than the minimum diameter of the upper face of the adhesive metal film 22, and the minimum diameter of the lower face of the adhesive metal film 22 in contact with the adhesive metal film 32 is smaller than the minimum diameter of the upper face of the adhesive metal film 32. Because of this folding-fan shape, part of the upper face and the side faces of the nitride semiconductor crystal films, and the joined portions between the side faces and the adhesive metal are covered with the protection layer 40 without a step separation. Accordingly, even if the upper face of the nitride semiconductor crystal films is roughened with the use of an alkali solution, the active layer and the reflecting contact electrodes 20 can be thoroughly protected. Thus, higher reliability and higher light extraction efficiency are achieved. Also, reflecting contact electrodes 20 each having a large area can be formed, and the reflectivity can be made higher. Furthermore, a decrease in operating voltage can be expected, since large reflecting contact electrodes can be formed. Also, since the protection layer 40 without a step separation is formed, leakage and short-circuiting in devices due to metal adherence or the like during the manufacturing procedures can be prevented. Further, since the protection layer 40 without a step separation is formed, the process to manufacture thin-film semiconductor light emitting devices can be tolerated, even though the process involves intensified impacts from the transfer, the bonding, and the laser lift-off technique, for example. Also, cracks and the likes are not formed in the protection layer 40.

Figure 5:
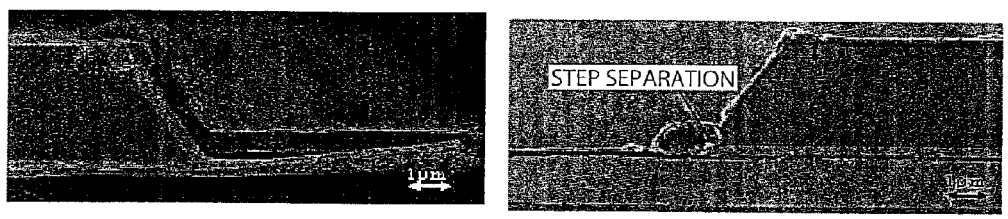
FIGS. 5(a) and 5(b) are electron micrographs of cross sections of semiconductor light emitting devices according to the embodiment and a comparative example.

As a comparative example of this embodiment, a semiconductor light emitting device is formed. This semiconductor light emitting device is manufactured in the same manner as in this embodiment, except that the area of the lower face of the nitride semiconductor crystal films in contact with the adhesive metal film 22 is the same as the area of the upper face of the adhesive metal film 22. FIGS. 5(a) and 5(b) show electron micrographs of sections of this embodiment and the comparative example, respectively. As can be seen from FIGS. 5(a) and 5(b), no step separations are formed in the protection layer in this embodiment, but a step separation is formed in the peripheral end region of the lower portion of the nitride semiconductor crystal films in a mesa shape in the comparative example. If a step separation is formed in a protection layer, cracks and the likes are easily formed in the protection layer during the manufacturing process. Also, if a protection layer having a step separation is formed as in the comparative example, the alkaline etching solution enters the device through the step separation and cracks, and the active layer and the reflecting contact electrode are etched. As a result, current leakage occurs, and outputs are degraded.

Figure 6:
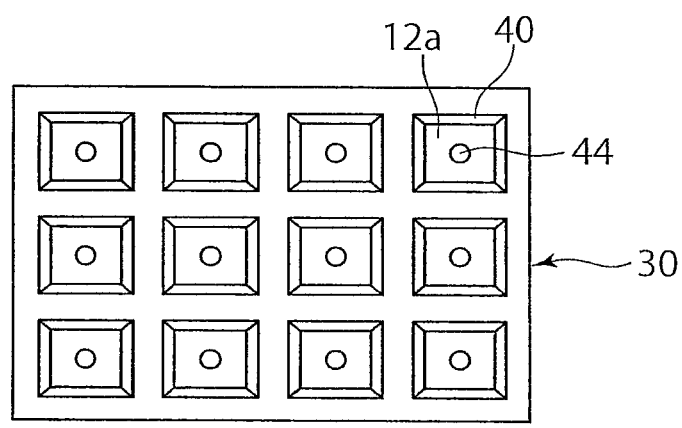
FIG. 6 is a plan view of the supporting substrate prior to the division into respective devices.

FIG. 6 is a plan view of semiconductor light emitting devices seen from the side of the n-electrodes 44 after the concavities and convexities are formed. As can be seen from FIG. 6, undivided devices are placed on the Si substrate 30. After that, a p-electrode 46 is formed on the face of the silicon substrate 30 on the opposite side from the side on which the n-electrodes 44 are formed, as shown in FIG. 3(c).

Figure 7:
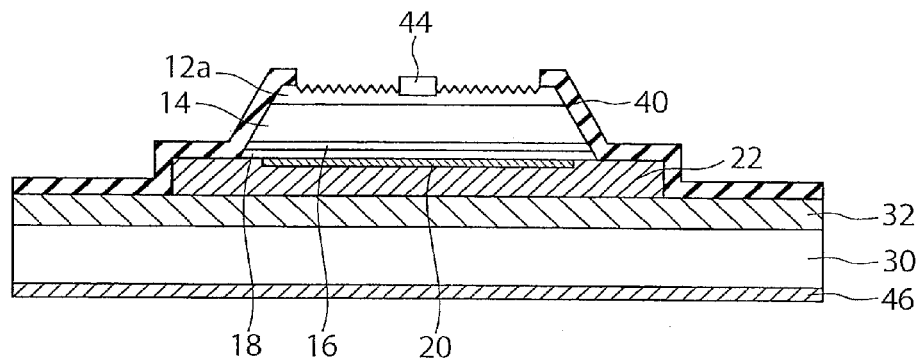
FIG. 7 is a cross-sectional view of a semiconductor light emitting device according to the embodiment.
Figure 8:
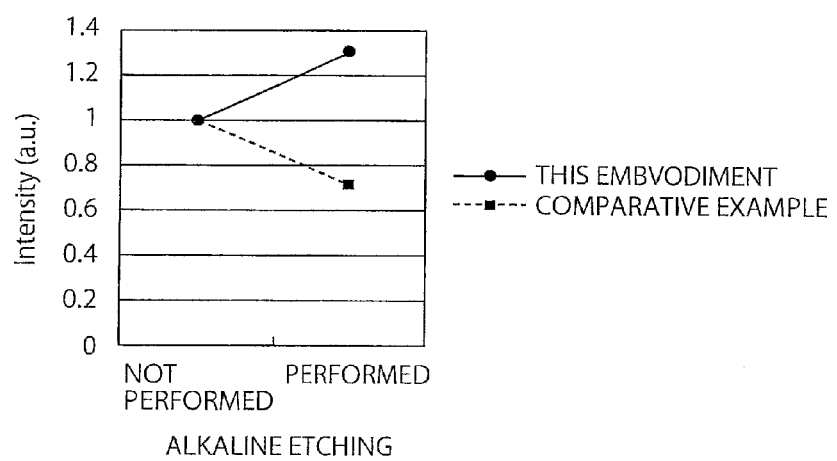
FIG. 8 is a graph showing the light extraction efficiencies of semiconductor light emitting devices according to the embodiment and the comparative example.

After the procedures shown in FIG. 3(c) are completed, dicing is performed on the protection layer 40, the adhesive metal films 22 and 32, and the Si substrate 30, to divide them into respective semiconductor light emitting devices. In this manner, the semiconductor light emitting device shown in FIG. 7 is completed. The semiconductor light emitting devices of the above described comparative example are also divided by dicing. The light extraction efficiency of each semiconductor light emitting device of this embodiment manufactured in the above described manner is 1.5 times higher than the light extraction efficiency of each semiconductor light emitting device of the comparative example, and is 1.3 times higher than the light extraction efficiency observed in a case where alkaline etching is not performed, as shown in FIG. 8.

As described so far, this embodiment can provide semiconductor light emitting devices having high light extraction efficiency, and a method for manufacturing such semiconductor light emitting devices.

The supporting substrate may be a silicon substrate, a silicon carbide substrate, a substrate formed by bonding germanium to a silicon substrate, or a substrate formed by plating a silicon substrate with a metal such as copper. The silicon substrate may be a substrate that has a plane orientation of (111), (110), or (100), and also has an off angle.

As for the protection layer, it is preferable to use a material that contains silicon dioxide, silicon nitride, zirconium oxide, niobium oxide, or aluminum oxide.

The chemical solution used in the alkaline etching may be tetramethylammonium hydroxide, other than potassium hydroxide.

As the reflecting contact electrodes, it is desirable to use aluminum, other than silver.

The adhesive metal film 22 preferably contains titanium, platinum, gold, or tungsten.

As the adhesive metal film 32, it is possible to use a low-melting-point metal that is a metal eutectic such as Au—Si, Ag—Sn—Cu, or Sn—Bi, or a non-solder material such as Au, Sn, or Cu, other than Au—Sn.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and sprit of the invention.

What is claimed is:

1. A semiconductor light emitting device comprising:
   a substrate;
   at least one metal layer provided on the substrate;
   a stack film including a p-type nitride semiconductor layer provided on the at least one metal layer, an active layer provided on the p-type nitride semiconductor layer and including a multiquantum well structure of a nitride semiconductor, and an n-type nitride semiconductor layer provided on the active layer;
   an n-electrode connected to the n-type nitride semiconductor layer;
   a p-electrode connected to the p-type nitride semiconductor layer; and
   a protection film protecting an outer circumferential region of an upper face of the n-type nitride semiconductor layer, side faces of the stack film, and a region of an upper face of the at least one metal layer other than a region in contact with the p-type nitride semiconductor layer,
   wherein the stack film has a tapered shape in cross-section, with an area of a film plane gradually increasing from the n-type nitride semiconductor layer toward the p-type nitride semiconductor layer, and concavities and convexities are formed in a region of the upper face of the n-type nitride semiconductor layer, and
   wherein the at least one metal layer comprises:
   a first metal layer provided between the substrate and the p-type nitride semiconductor layer; and
   a second metal layer provided between the substrate and the first metal layer, and the second metal layer having a minimum diameter that is smaller than a minimum diameter of the first metal layer but is larger than a minimum diameter of the p-type nitride semiconductor layer.

2. The device according to claim 1, further comprising a contact electrode provided between the p-type nitride semiconductor layer and the at least one metal layer.

3. The device according to claim 2, wherein the contact electrode contains one of silver and aluminum.

4. The device according to claim 1, wherein the substrate is one of a silicon substrate, a silicon carbide substrate, a copper substrate and a substrate formed by bonding germanium to a silicon substrate.

5. The device according to claim 1, wherein the second metal layer contains one of titanium, platinum, gold, and tungsten.

6. The device according to claim 1, wherein the protection film is one of a silicon dioxide layer, a silicon nitride layer, a zirconium oxide layer, a niobium oxide layer, and an aluminum oxide layer.

7. The device according to claim 1, wherein the first metal layer is one of an Au—Sn layer, an Au—Si layer, an Ag—Sn—Cu layer, an Sn—Bi layer, an Au layer, an Sn layer, and a Cu layer.

* * * * *